United States Patent [19]
Butler

[11] 4,123,129
[45] Oct. 31, 1978

[54] MODULAR ELECTRONIC INSTRUMENT CABINETS

[75] Inventor: Marlow Dole Butler, Portland, Oreg.

[73] Assignee: Tektronix, Inc., Beaverton, Oreg.

[21] Appl. No.: 743,016

[22] Filed: Nov. 18, 1976

[51] Int. Cl.² .............................................. A47B 43/00
[52] U.S. Cl. ......................... 312/257 R; 312/257 SK; 312/111
[58] Field of Search ................. 312/257 SM, 257 SK, 312/257 A, 257 R, 111, 107, 236, 196

[56] References Cited

U.S. PATENT DOCUMENTS

| | | | |
|---|---|---|---|
| 2,942,924 | 6/1960 | Stangert | 312/196 |
| 3,056,639 | 10/1962 | Caminker et al. | 312/257 SK |
| 3,159,436 | 12/1964 | Davis | 312/107 |
| 3,178,246 | 4/1965 | Riles | 312/257 SK |
| 3,283,058 | 11/1966 | Johnson, Jr. et al. | 312/257 R |
| 3,360,320 | 12/1967 | Lust | 312/257 R |
| 3,525,560 | 8/1970 | Gasner et al. | 312/257 R |
| 3,779,177 | 12/1973 | Gigante | 312/257 A |
| 3,836,218 | 9/1974 | Hallal | 312/257 R |
| 3,870,389 | 3/1975 | Killam | 312/257 SK |
| 3,901,571 | 8/1975 | Begitschke et al. | 312/257 R |

FOREIGN PATENT DOCUMENTS

| | | | |
|---|---|---|---|
| 884,200 | 10/1971 | Canada | 312/257 SM |
| 440,609 | 12/1967 | Switzerland | 312/111 |

*Primary Examiner*—Victor N. Sakran
*Attorney, Agent, or Firm*—Adrian J. La Rue

[57] ABSTRACT

Modular electronic instrument cabinets are provided with supporting members extending between a front panel and a rear panel to form a frame. The supporting members have first grooves in which edges of closure members are slidably and removably positioned and second grooves in which edges of trim, trim and positioning strips and trim and interconnecting or interlocking strips are received to provide a cosmetic appearance to the supporting members and cabinet, to position cabinet feet and other elements and the interconnect or interlock adjacent cabinets of similar construction together in a rack and/or stack configuration.

6 Claims, 15 Drawing Figures

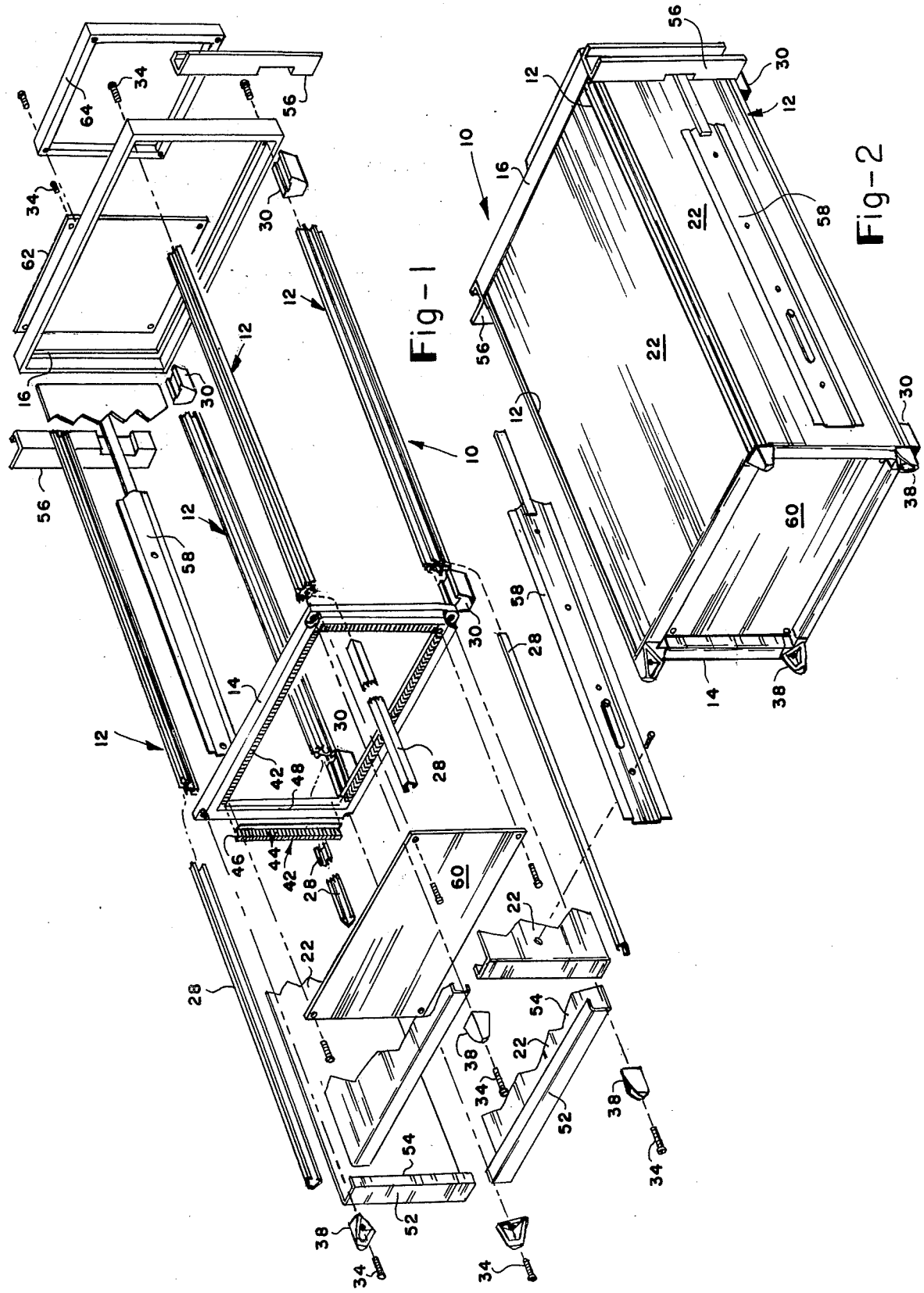

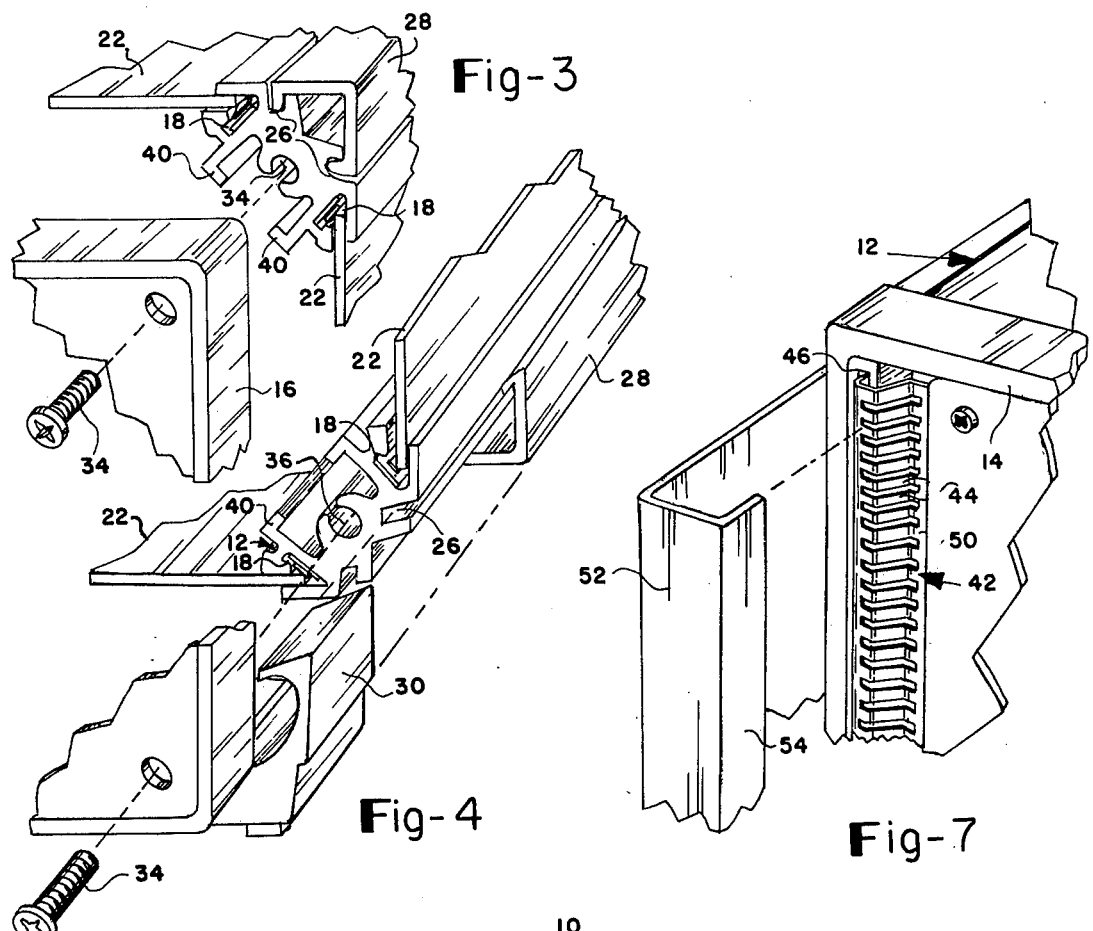
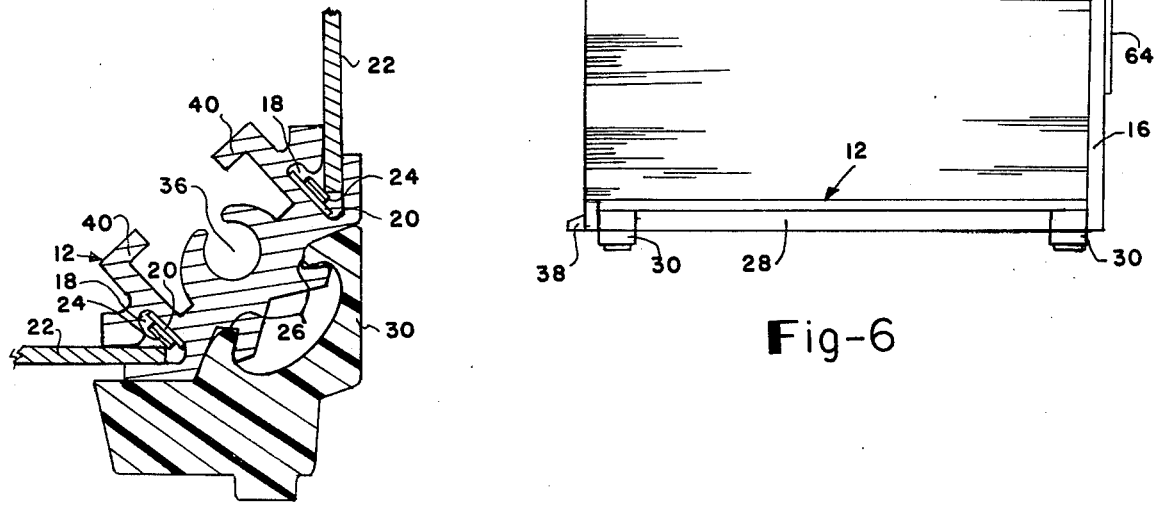

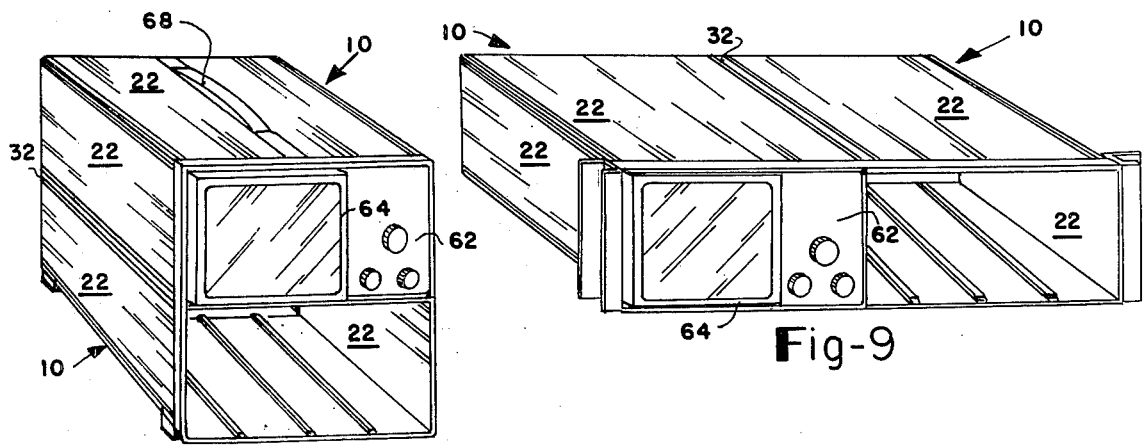
Fig-8
Fig-9
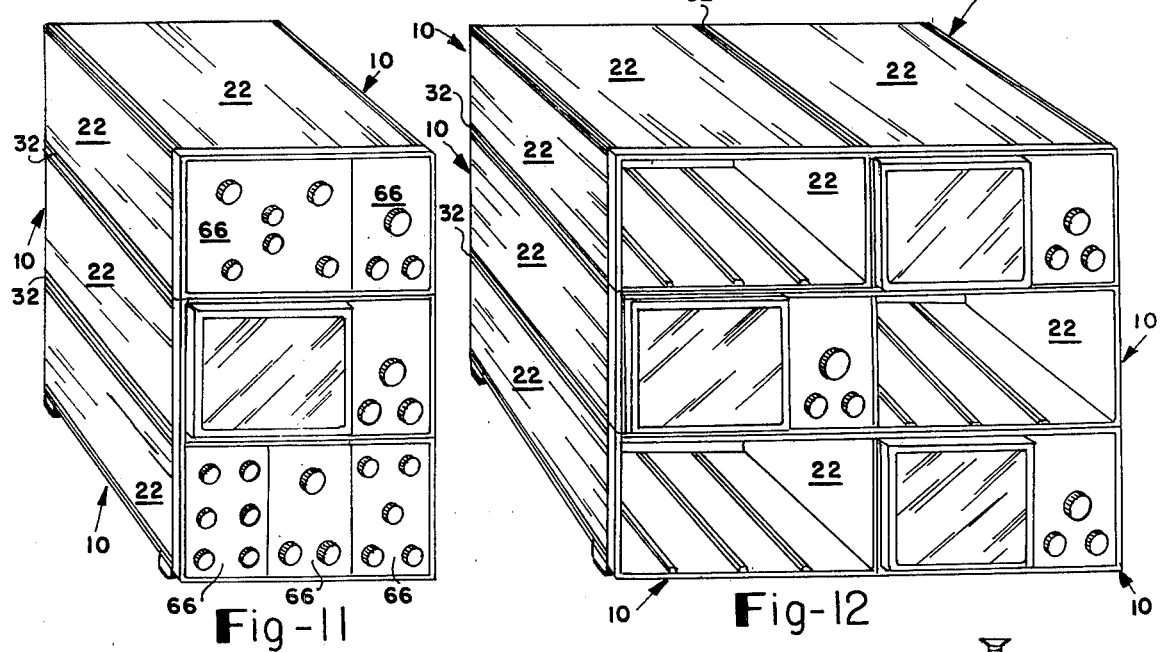
Fig-11
Fig-12
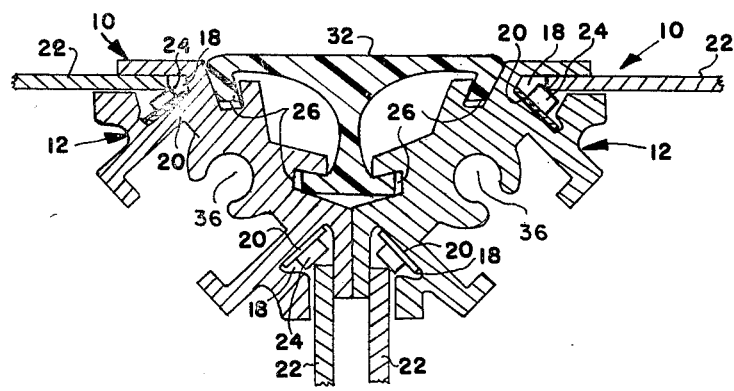
Fig-10
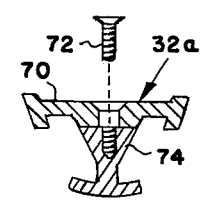
Fig-13

MODULAR ELECTRONIC INSTRUMENT CABINETS

BACKGROUND OF THE INVENTION

Cabinets for electrical and/or electronic equipment have taken many forms and the construction of these cabinets has varied from simple to complex. Size is also an important consideration in order to completely house the electrical and electronic components and elements which are increasing in number as components are decreased in size. Ease of assembly and sturdy construction are important features in the manufacture of electronic cabinets, and they must meet severe requirements regarding shock, vibration, electromagnetic intereference shielding and transportability in the case of military requirements. Removal of closure members to enable efficient servicing is a highly desirable feature of electronic cabinets. System growth is always an important factor to permit users to add additional electronic equipment to existing equipment and maintain the uniformity of configuration of the electronic cabinets, especially with regard to attractive appearance and functionality.

SUMMARY OF THE INVENTION

The present invention relates to electronic instrument cabinets or enclosures and more particularly to electronic cabinets of simplified construction that are capable of modular formation.

The present invention is realized by the use of supporting members of unique configuration which extend between and are secured to front and rear panel members thereby forming a frame. The supporting members are provided with first grooves in which are slidably removed and disposed edges of closure members and second grooves in which edges of trim strips, trim and positioning strips and trim and interconnecting or interlocking strips are received. The trim strips provide a finished appearance to the cabinet as well as being functional for mounting cabinets in a modular configuration.

An object of the present invention is to provide an electronic instrument cabinet that is easy to assemble and economical to manufactue, has a sturdy construction and has an attractive appearance and function.

Another object of the present invention is the provision of an electronic instrument cabinet that is capable of modular construction.

A further object of the present invention is to provide an electronic instrument cabinet which has removal closure members to enable easy servicing access.

An additional object of the present invention is the provision of an electronic instrument cabinet having support members to each end of which panel members are secured thereby forming a frame and closure members are slidably received into the support members to enclose the spaces between the support members.

Still a further object of the present invention is to provide an electronic instrument cabinet having support members to each end of which panel members are secured thereby forming a frame and trim strips, trim and positioning strips and trim and interconnecting or interlocking strips are positioned onto the support members to provide a cosmetic appearance to the support members and cabinet, to position cabinet feet and other elements and to interconnect or interlock adjacent cabinets in a rack or stack configuration.

BRIEF DESCRIPTION OF THE DRAWINGS

Other objects and advantages of the present invention will be apparent from the following detailed description of preferred embodiments thereof and from the attached drawings of which:

FIG. 1 is an exploded perspective view of the various parts to form an electronic cabinet in an unassembled condition;

FIG. 2 is a perspective view of the electronic cabinet in an assembled condition;

FIG. 3 is a part exploded and perspective view of a front panel member and upper supporting member;

FIG. 4 is a part exploded and perspective view of a front panel member, foot and bottom supporting member;

FIG. 5 is a part elevational view of a bottom supporting member and foot in position thereon;

FIG. 6 is a part side elevational view of an electronic cabinet;

FIG. 7 is a part exploded and perspective view of a rear panel member and closure member;

FIG. 8 is a perspective view showing different modules of electronic cabinets connected together to form an electronic instrument in stacked configuration;

FIG. 9 is a perspective view showing different modules of electronic cabinets connected together to form an electronic instrument in racked configuration;

FIG. 10 is a cross-sectional view taken along lines 10—10 of FIG. 9;

FIG. 11 is a view similar to FIG. 8 showing the modules in a stacked configuration;

FIG. 12 is a view similar to FIGS. 9 and 11 showing the modules in a racked and stacked configuration;

FIG. 13 is a cross-sectional view of an interlocking member that locks electronic cabinets together;

DETAILED DESCRIPTION OF THE INVENTION

Figure 14:
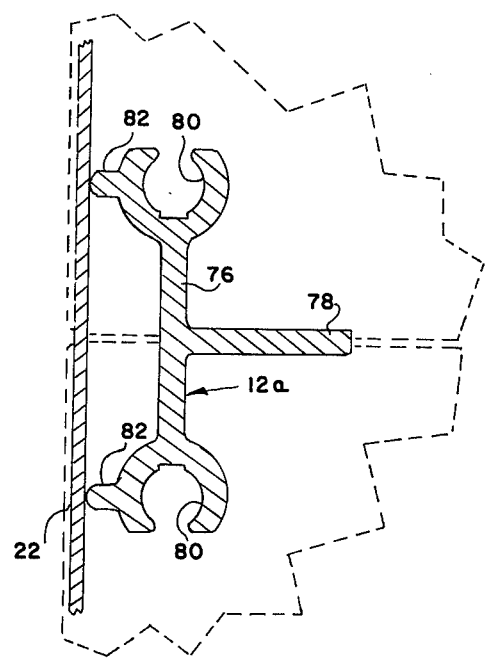
FIG. 14 is a view, partly in section, showing an embodiment of a supporting member.

Turning now to the drawings and more particularly FIGS. 1-7, a modular electronic cabinet 10 is shown in its assembled condition in FIG. 2. As shown in FIG. 1, supporting members 12 extend between and are secured to a rear panel member 14 and a front panel member 16. Panel members 14 and 16 are preferably made by conventional casting techniques. Supporting members 12 are of unique construction and they are preferably formed from metal such as, for example, aluminum by conventional extrusion techniques. Each supporting member 12 is provided with first grooves 18 at the bottom of which are secured electromagnetic interference (EMI) shielding strips 20, which are completely disclosed in U.S. patent application Ser. No. 743,014, filed Nov. 18, 1976 (PF 2390). The edges of respective closure member 22 are slidably received in grooves 18 in electrical engagement with EMI strips 20 and the spring contact members 24 of EMI strips 20 springably force the closure member edges against an outer wall of grooves 18 as shown in FIG. 5. As can be discerned, grooves 18 are of such configuration and orientation that the closure members 22 can be readily slid into position between aligned grooves of two supporting members and also removed therefrom with ease to enable easy servicing of the circuitry therein.

Second grooves 26 are provided in supporting members 12 adjacent to and outward from grooves 18 and they receive therein inwardly-directed ends of a V-shaped trim strip 28 (see FIGS. 3, 4 and 6), a foot 30 (see FIGS. 4, 5 and 6), or an interconnecting strip 32 having a T-shape configuration in cross-section (see FIG. 10). The inwardly-directed ends of trim strip 28 and feet 30 are disposed in respective grooves 26 of the same supporting member 12; whereas the inwardly-directed ends of interconnecting strip 32 are disposed in respective outer grooves 26 of adjacent supporting members 12 and the inner grooves 26 of these adjacent supporting members receive outwardly-directed projections of the interconnecting strip 32 as shown in FIG. 10 thereby connecting adjacent electronic cabinets 10 together in a racked or stacked configuration as desired and as illustrated in FIGS. 8, 9, 11 and 12.

This rack and stack capability is able to be accomplished because supporting members 12 are located at each corner of the cabinet. The interconnecting strip 32, where used, also provides a trim and therefore an aesthetic appearance to the cabinet in this section. The interconnecting strip 32 is positioned in adjacent supporting members 12 in each side when stacking electronic instruments as shown in FIGS. 8, 11 and 12 and in adjacent supporting members 12 in the top and bottom when racking electronic instruments as shown in FIGS. 9 and 12. Interconnecting strips 32 and trim strips 28 are preferably formed from a suitable plastic material in accordance with well-known extrusion techniques.

Panels 14 and 16 are secured to the respective ends of supporting members 12 via self-tapping screws 34 which are threadably disposed in almost circular grooves 36. Feet 38 are also secured to rear panel 14 via screws 34. Feet 28 are used to stand the instrument in an upright position. Grooves 36 will accommodate different sizes of screws due to there being open grooves and they will resiliently engage the screws. Projections 40 are provided on supporting members 12 for mounting circuitry, components or devices as desired.

An EMI strip 42 having spring members 44 has a leg 46 that fits into slot 48 in rear panel member 14 and spring members 44 extend along an inside surface of a stepped section of the rear panel member and it contains an outwardly-directed leg 50 at the inner end of spring members 44. The ends of closure members 22 that engage rear panel member 14 are provided with right angle sections 52 and 54 as best shown in FIG. 7 which engage rear panel member 14 and the spring members 44 of EMI strip 42. Once the edges of closure members 22 are positioned within respectively-aligned grooves 18 of supporting members 12 and sections 52 and 54 are in position onto rear panel member 14 and EMI strip 42, legs 38 are secured to rear panel member 14 thereby securing closure members 22 in position. Handles 56 are secured via screws onto front panel member 16 and chassis sections 58 are secured onto side closure members 22 as shown in FIG. 2 if desired to enable electronic cabinet 10 to be slid along chasis tracks (not shown) mounted in a larger cabinet housing other electronic cabinets.

A plate 60 is secured onto rear panel member 14 via screws to maintain EMI strips 42 in position when any of closure members 22 are removed and to permit easy access to the rear section of the cabinet. A plate 62 and bezel 64 are secured via screws onto front panel member 16. Panel 62 can have switches indicating lights and other electrical components mounted thereon and bezel 64 covers a display device such as for example a cathode ray tube. Other display devices can be used and bezel 64 will take the necessary form to accommodate such devices. The bottom electronic cabinet in FIG. 8 and the right hand one in FIG. 9 as well as the bottom left, middle right and top left cabinets in FIG. 12 can be of the form in which plug-ins 66, as shown in FIG. 11, can be latchably secured to form a cathode ray oscilloscope and circuitry which provides appropriate signal sources. If a cathode ray tube is to be mounted in the electronic cabinet so formed, it can best be supported therein by the cathode ray tube mounting arrangement that is completely disclosed in U.S. patent application Ser. No. 743,017, filed Nov. 18, 1976, (PF 2395). Of course, the cabinets can be utilized to enclose any type of electronic circuitry thereby forming any instruments as desired.

If desired, a spring-biased handle 68 can be mounted on a top closure member 22 in FIG. 8 to enable a person to readily move the instrument to any desired location.

FIG. 13 illustrates a locking strip 32a which includes an upper member 70 which is secured via screws 72 to lower member 74. Members 70 and 72 can readily be formed by conventional extrusion techniques. Locking strip 32a is of substantially the same cross-sectional configuration as interconnecting strip 32, and, when locking strip 32a is slidably positioned within respective grooves 26 of adjacent supporting members 12 of electronic cabinets 10, upper member 70 is loosely secured to lower member 74 by screws 72. Once in position, screws 72 are tightened thereby causing the supporting members to be locked together. Locking member 32a is generally used in a production situation wherein a manufacturer wants an electronic instrument to include at least two electronic cabinets to be securely locked together to form such instrument. An example of this would be a plug-in oscilloscope where one electronic cabinet would be the display module and the interlocked cabinet would be the plug-in module in which plug-in units would be received. Interconnecting strips 32 are generally used by customers to interconnect different electronic instruments contained within the modular electronic cabinets 10 to formulate an instrument package that would be required to perform one or a number of functions.

FIG. 14 shows a supporting member 12a which is another embodiment of supporting member 12. Supporting member 12a can be readily formed by extrusion techniques and it has legs 76 and 78 which has a T-shape in cross-section. The ends of leg 76 terminate into grooves 80 into which screws 34 are threadably disposed to secure front panels 16 and rear panels 14 to supporting member 12a in order to construct a monolithic electronic instrument. Supporting members 12 are located at the corners of this monolithic instrument and supporting members 12a are located intermediate the corner supporting members 12 so that each side closure member 22 has its edges disposed in aligned grooves 18 of respective supporting members 12 and extends along intermediate supporting member 12a. Projections 82 are provided on leg 76 which serve as spacing projections to properly space closure member 22 and provide support therefor. Leg 78 provides a stiffening member onto which components and the like can be mounted.

Figure 15:
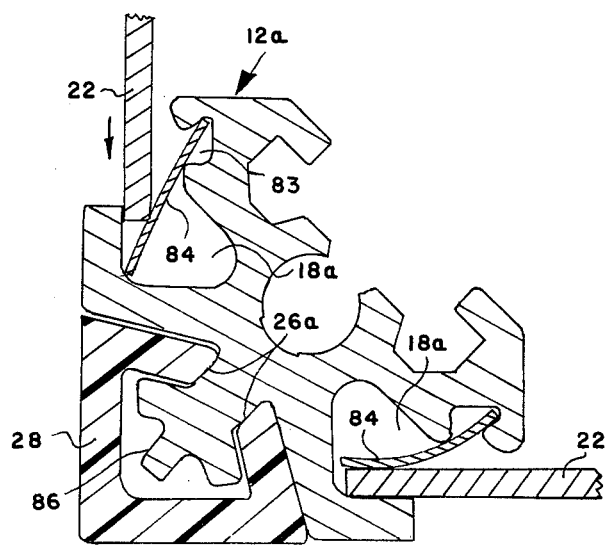
FIG. 15 is a cross-sectional view of an alternative embodiment of the supporting member.

FIG. 15 shows supporting member 12a which is an alternative embodiment of the supporting member 12. Supporting member 12a includes grooves 83 in which are slidably disposed thin and springable metal EMI shielding members 84 in the form of a strip and preferably being of stainless steel. Closure members 22, when the edges thereof are slid along respective first grooves 18a, will wipingly engage shielding member 84 and cam them away from the outer walls of grooves 18a with the springable characteristics of EMI strips 84 springably forcing and maintaining the edges of closure members 22 against these outer walls. A projection 86 is provided between second grooves 26a to provide support for V-shaped trim strip 28. Supporting member 12a is otherwise the same as supporting member 12.

The supporting members, panel members and closure members can be formed of a suitable plastic material such as, for example, flame-retardant and shock-resistant acrylonitrile butadiene styrene (ABS) which is then coated with a suitable metal at least on the inner surface of the closure members.

As can be discerned, unique modular electronic instrument cabinets have been disclosed that include parts that are easy to fabricate, easy to assemble the parts into completed cabinets and the modular cabinets can be readily interconnected or interlocked to provide an instrument mix which will enable one or more functions to be performed.

While preferred embodiments of the present invention have been illustrated and described, it will be apparent that changes and modifications may be made to this invention without departing from its broadest aspects. The appended claims therefore cover all such changes and modifications as fall therewithin.

The invention is claimed in accordance with the following:

1. A modular electronic cabinet, comprising:
   first and second panel members;
   supporting members extending between said first and second panel members at the corners thereof, each of said supporting members having a pair of first grooves being respectively disposed in alignment with the respective first grooves of the respective supporting members, each of said supporting members having a pair of second grooves and a third groove provided between said pair of first grooves;
   securing means extending through said panel members and in engagement with respective ones of said third groove thereby securing said panel members to said supporting members whereby frame means is formed;
   strip means having edges matable with said second grooves of said supporting members; and
   closure members having edges thereof slidably positioned along the aligned first grooves of said supporting members thereby enclosing said frame means;
   wherein said strip means is a trim strip and said edges thereof are matable with said second grooves for trimming the corners of the electronic cabinet or an interconnecting strip whereby said edges define first edges for slidably engaging the inner second grooves of adjacent supporting members and second edges for slidably engaging the outer second grooves of said adjacent supporting members to interconnect said modular electronic cabinet with another modular electronic cabinet.

2. A modular electronic cabinet according to claim 1, wherein a foot having edges slidably matable with said second grooves is positioned along said second grooves of the bottom supporting members against said strip means thereon to properly position said foot.

3. A modular electronic cabinet according to claim 1, wherein electromagntic interference shielding strips are positioned in said first grooves providing electrical connection between said supporting members and said closure members.

4. A modular electronic cabinet according to claim 1, wherein said interconnecting strip has a substantially T-shape in cross section and is unitary in construction.

5. A modular electronic cabinet according to claim 1, wherein said interconnecting strip has a substantially T-shape in cross section and includes first and second members and securing means for securing said first and second members together.

6. A modular electronic cabinet according to claim 1 further comprising an intermediate supporting member disposed between corner supporting members and extending between said first and second panel members, said intermediate supporting member including fourth grooves into which said securing members is disposed to secure said panel means thereto, and projections provided on said intermediate supporting member against which said closure member engages.

* * * * *

UNITED STATES PATENT AND TRADEMARK OFFICE
CERTIFICATE OF CORRECTION

PATENT NO. : 4,123,129
DATED : October 31, 1978
INVENTOR(S) : MARLOW DOLE BUTLER It is certified that error appears in the above-identified patent and that said Letters Patent are hereby corrected as shown below:

Column 1, line 45, change "manufactue" to --manufacture--.

Column 3, line 36, change "28" to --38--.

Signed and Sealed this

Twenty-second Day of May 1979

[SEAL]

Attest:

RUTH C. MASON
Attesting Officer

DONALD W. BANNER
Commissioner of Patents and Trademarks